US012790685B2

(12) United States Patent
Huang et al.

(10) Patent No.: US 12,790,685 B2
(45) Date of Patent: Nov. 10, 2026

(54) GAS-PHASE REACTOR SYSTEM AND METHOD OF CLEANING SAME

(71) Applicant: ASM IP Holding B.V., Almere (NL)

(72) Inventors: Jianqiu Huang, Phoenix, AZ (US); Gnyanesh Trivedi, Tempe, AZ (US); Yingzong Bu, Powell, OH (US); Todd Dunn, Cave Creek, AZ (US); Thomas Fitzgerald, Gilbert, AZ (US); Akshay Phadnis, Phoenix, AZ (US); Paul Ma, Scottsdale, AZ (US)

(73) Assignee: ASM IP Holding B.V., Almlere (NL)

( * ) Notice: Subject to any disclaimer, the term of this patent is extended or adjusted under 35 U.S.C. 154(b) by 898 days.

(21) Appl. No.: 17/946,304

(22) Filed: Sep. 16, 2022

(65) Prior Publication Data

US 2023/0089167 A1 Mar. 23, 2023

Related U.S. Application Data

(60) Provisional application No. 63/246,520, filed on Sep. 21, 2021.

(51) Int. Cl.
*C23C 16/44* (2006.01)

(52) U.S. Cl.
CPC ...... *C23C 16/4405* (2013.01); *C23C 16/4412* (2013.01)

(58) Field of Classification Search
CPC ............ C23C 16/4405; C23C 16/4412; C23C 16/45561; H01J 37/3244; H01J 37/32449; H01L 21/67028
USPC ........... 156/345.33, 345.34, 345.35; 118/715
See application file for complete search history.

(56) References Cited

U.S. PATENT DOCUMENTS 5,330,352 A * 7/1994 Watanabe ............... C30B 31/16 432/152
6,042,687 A * 3/2000 Singh .................... H01J 37/321 216/68
6,111,225 A * 8/2000 Ohkase ............... H10P 72/0434 118/724
6,113,698 A * 9/2000 Raaijmakers ..... C23C 16/45521 118/715
6,183,565 B1 * 2/2001 Granneman ...... C23C 16/45521 118/724
7,604,708 B2 * 10/2009 Wood ...................... H01J 37/34 156/345.35
8,329,593 B2 * 12/2012 Yousif ................. H01J 37/3244 438/725
11,018,045 B2 * 5/2021 Seo ......................... C23C 14/50
2004/0099378 A1 * 5/2004 Kim .................... C23C 16/4558 156/345.33

(Continued)

FOREIGN PATENT DOCUMENTS

CN 1882804 A 12/2006
CN 101298693 A 11/2008
CN 104128059 B 11/2015
CN 102747418 B 12/2015

(Continued)

*Primary Examiner* — Rudy Zervigon
(74) *Attorney, Agent, or Firm* — Snell & Wilmer L.L.P.

(57) ABSTRACT

Gas-phase reactor systems and methods of cleaning same are disclosed. Exemplary systems include a cleaning gas diffuser within a reaction chamber to facilitate cleaning of components, such as a susceptor, within the reaction chamber. The cleaning gas diffuser can be configured to provide a flow of a cleaning reactant over one or more surfaces within the reaction chamber.

14 Claims, 10 Drawing Sheets

(56) References Cited

U.S. PATENT DOCUMENTS

| | | | | |
|---|---|---|---|---|
| 2006/0029735 | A1* | 2/2006 | Ko | H01L 21/0223 427/248.1 |
| 2007/0084406 | A1 | 4/2007 | Yudovsky | |
| 2009/0169465 | A1 | 7/2009 | Jang | |
| 2010/0059478 | A1* | 3/2010 | Lee | H01J 37/32431 156/345.33 |
| 2013/0098455 | A1* | 4/2013 | Ng | C23C 16/303 137/561 R |
| 2014/0166618 | A1* | 6/2014 | Tadigadapa | H01L 21/31116 156/345.29 |
| 2019/0062918 | A1* | 2/2019 | Shaikh | C23C 16/04 |
| 2019/0145001 | A1* | 5/2019 | Park | C23C 16/45502 118/723 R |
| 2019/0148211 | A1* | 5/2019 | Seo | C23C 14/50 118/728 |

FOREIGN PATENT DOCUMENTS

| | | | |
|---|---|---|---|
| CN | 104103483 8 | | 8/2016 |
| CN | 104264128 | B | 6/2017 |
| CN | 105986244 | B | 1/2019 |
| CN | 109126672 | A | 1/2019 |
| CN | 110186064 | A | 8/2019 |
| CN | 111172587 | A | 5/2020 |
| CN | 111333141 | A | 6/2020 |
| CN | 110329989 | B | 4/2022 |
| EP | 0572356 | B1 | 12/1996 |
| KR | 20010020831 | A | 3/2001 |
| KR | 20060113465 | A | 11/2006 |
| TW | 202121488 | | 6/2021 |
| WO | 8912907 | A1 | 12/1989 |
| WO | 2018111151 | A1 | 6/2018 |
| WO | 2021012674 | A1 | 1/2021 |
| WO | 2021223267 | A1 | 11/2021 |

* cited by examiner

GAS-PHASE REACTOR SYSTEM AND METHOD OF CLEANING SAME

CROSS-REFERENCE TO RELATED APPLICATIONS

This application is a nonprovisional of, and claims priority to and the benefit of, U.S. Provisional Patent Application No. 63/246,520, filed Sep. 21, 2021 and entitled "GAS-PHASE REACTOR SYSTEM AND METHOD OF CLEANING SAME," which is hereby incorporated by reference herein.

FIELD OF INVENTION

The present disclosure generally relates to gas-phase reactor systems and methods of using same. More particularly, the disclosure relates to methods and apparatus for cleaning gas-phase reactor systems.

BACKGROUND OF THE DISCLOSURE

Gas-phase reactors, such as chemical vapor deposition (CVD), plasma-enhanced CVD (PECVD), atomic layer deposition (ALD), and the like can be used for a variety of applications, including depositing and etching materials on a substrate surface. For example, gas-phase reactors can be used to deposit and/or etch layers on a substrate to form semiconductor devices, flat panel display devices, photovoltaic devices, microelectromechanical systems (MEMS), and the like.

A typical gas-phase reactor system includes one or more reactors, each reactor including a reaction chamber, a susceptor within the reaction chamber, and one or more gas sources fluidly coupled to the reaction chamber. During various gas-phase processes, such as deposition processes, material is deposited onto a substrate and can also deposit onto surfaces within the reaction chamber—e.g., onto walls of the reaction chamber, onto surfaces of the susceptor, and the like.

Often, the deposition on surfaces within the reaction chamber can result in undesirable non-uniformity of layers deposited onto substrates within the reaction chamber, undesired particle formation during a deposition process, and the like. To mitigate such unwanted effects, surfaces within the reaction chamber can be periodically cleaned. Unfortunately, many cleaning processes can take a relatively long time, which adds to time and expense of fabricating devices using the reactor. Further, many cleaning processes may not be able to readily clean various surfaces within the reaction chamber. Accordingly, improved gas-phase methods and systems for cleaning an interior of a reaction chamber are desired.

Any discussion of problems and solutions involved in the related art has been included in this disclosure solely for the purposes of providing a context for the present disclosure, and should not be taken as an admission that any or all of the discussion was known at the time the invention was made.

SUMMARY OF THE DISCLOSURE

Various embodiments of the present disclosure relate to gas-phase apparatus and systems and methods of using the gas-phase apparatus and systems. The apparatus, systems and methods can be used in connection with a variety of applications, including, for example, the manufacturing of electronic devices. While the ways in which various embodiments of the present disclosure address drawbacks of prior methods and systems are discussed in more detail below, in general, various embodiments of the disclosure provide improved apparatus, systems, and methods suitable for rapidly cleaning interior surfaces of a reaction chamber. Use of exemplary systems and methods described herein can significantly reduce reaction chamber cleaning times, reduce particle formation during operation (e.g., deposition processes), produce films or layers with improved uniformity (reduced nonuniformity), and mitigate damage to reaction chamber surface during a cleaning process.

In accordance with at least one embodiment of the disclosure, a reactor system is provided. An exemplary reactor system includes a reaction chamber comprising an upper chamber portion and a lower chamber portion, a gas distribution device for providing gas to the upper chamber portion, a susceptor positioned below the gas distribution device, a first cleaning gas diffuser, a cleaning reactant source comprising a cleaning reactant fluidly coupled to the first cleaning gas diffuser, and at least one exhaust source coupled to the reaction chamber. In accordance with examples of the disclosure, the first cleaning gas diffuser includes a first injector portion comprising a plurality of holes. The first injector portion can be positioned within the lower chamber portion, the upper chamber portion, or therebetween. In accordance with additional examples, the first injector portion comprises an arcuate shaped portion. In accordance with other examples, the first injector portion comprises a linear shaped portion. The linear or arcuate portions can include a plurality of holes to provide a cleaning reactant to the reaction chamber. The reactor system can further include a moveable shaft to move the susceptor in a vertical direction. In accordance with further examples, the reactor system further includes a second cleaning gas diffuser, which can be positioned within the lower chamber portion, the upper chamber portion, or therebetween. In accordance with further examples, the reactor system includes an isolation plate between the upper chamber portion and the lower chamber portion. The first injector portion can be above or below the isolation plate.

In accordance with additional embodiments of the disclosure, a method of cleaning an interior of a reaction chamber is disclosed. An exemplary method includes providing a reactor system including a reaction chamber comprising an upper chamber portion and a lower chamber portion, a gas distribution system for providing gas within the reaction chamber, a susceptor, a cleaning gas diffuser comprising an injector portion within the reaction chamber, and a cleaning reactant source; and using the cleaning gas diffuser, providing a cleaning reactant from the cleaning reactant source to the lower chamber portion to clean the susceptor and the lower chamber portion. In accordance with examples of these embodiments, the method further includes a step of providing an inert gas through the gas distribution device. Exemplary methods can further include moving the susceptor from a processing position to a cleaning position prior to the step of providing the cleaning reactant.

These and other embodiments will become readily apparent to those skilled in the art from the following detailed description of certain embodiments having reference to the attached figures; the invention not being limited to any particular embodiment(s) disclosed.

BRIEF DESCRIPTION OF THE DRAWING FIGURES

A more complete understanding of exemplary embodiments of the present disclosure can be derived by referring to the detailed description and claims when considered in connection with the following illustrative figures.

FIG. 13 illustrates a multi-chamber reactor system in accordance with examples of the disclosure.

It will be appreciated that elements in the figures are illustrated for simplicity and clarity and have not necessarily been drawn to scale. For example, the dimensions of some of the elements in the figures may be exaggerated relative to other elements to help improve understanding of illustrated embodiments of the present disclosure.

DETAILED DESCRIPTION OF EXEMPLARY EMBODIMENTS

Although certain embodiments and examples are disclosed below, it will be understood by those in the art that the invention extends beyond the specifically disclosed embodiments and/or uses of the invention and obvious modifications and equivalents thereof. Thus, it is intended that the scope of the invention disclosed should not be limited by the particular disclosed embodiments described below.

The present disclosure generally relates to gas-phase apparatus, reactor systems, and methods. The apparatus, systems and methods as described herein can be used to process substrates, such as semiconductor wafers, to form, for example, electronic devices. By way of examples, the systems and methods described herein can be used to form a metal-containing layer, such as layers comprising molybdenum.

In this disclosure, gas can include material that is a gas at normal temperature and pressure (NTP), a vaporized solid and/or a vaporized liquid, and can be constituted by a single gas or a mixture of gases, depending on the context. A gas other than a process gas, i.e., a gas introduced without passing through a gas distribution assembly, other gas distribution device, or the like, can be used for, e.g., sealing the reaction space, and can include a seal gas, such as a rare gas.

Further, in this disclosure, any two numbers of a variable can constitute a workable range of the variable, and any ranges indicated may include or exclude the endpoints. Additionally, any values of variables indicated (regardless of whether they are indicated with "about" or not) may refer to precise values or approximate values and include equivalents, and may refer to average, median, representative, majority, or the like. Further, in this disclosure, the terms "including," "constituted by" and "having" can refer independently to "typically or broadly comprising," "comprising," "consisting essentially of," or "consisting of" in some embodiments. In this disclosure, any defined meanings do not necessarily exclude ordinary and customary meanings in some embodiments.

Figure 1:
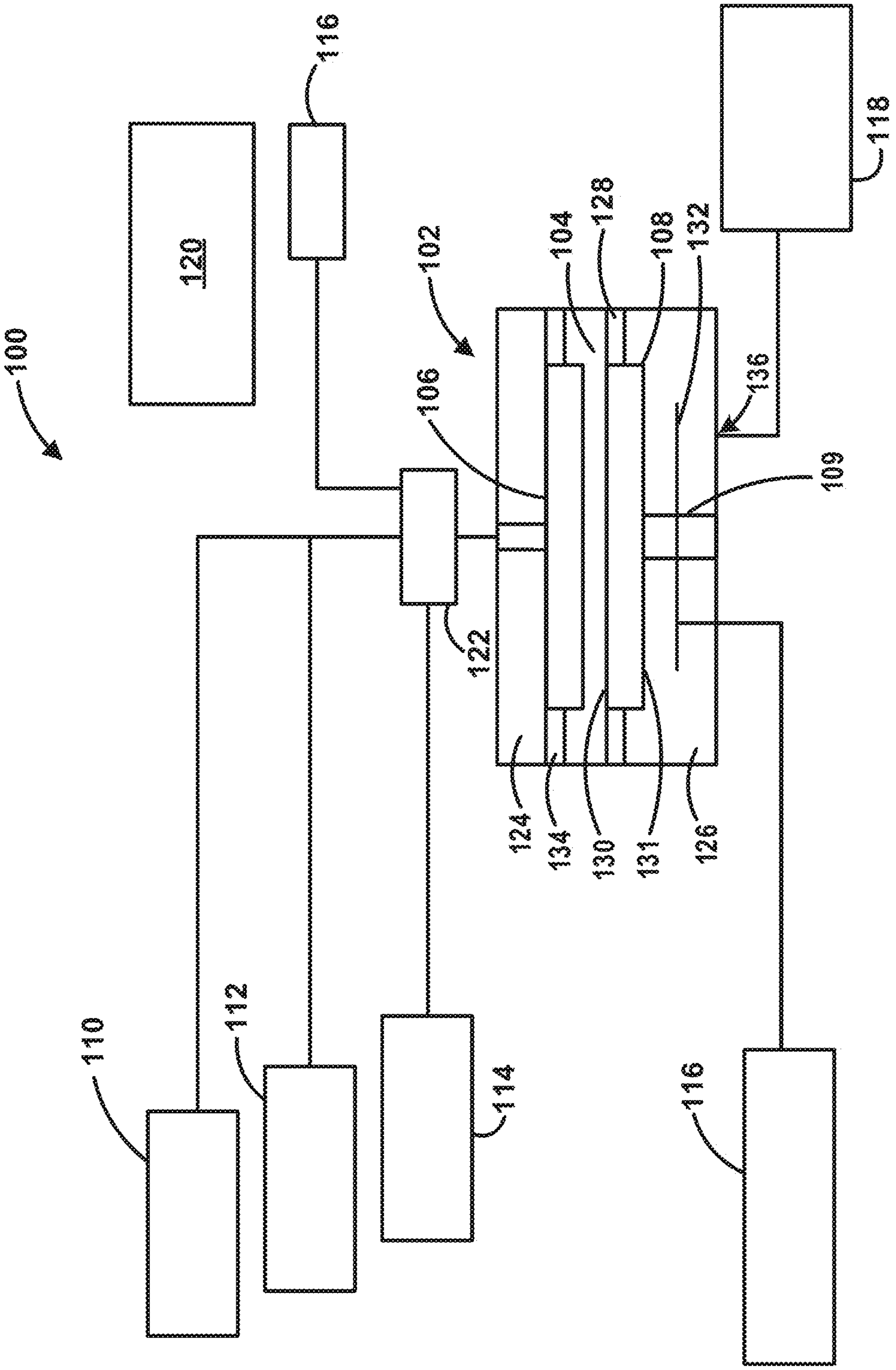
FIG. 1 illustrates a reactor system in accordance with at least one embodiment of the disclosure.

Turning now to the figures, FIG. 1 illustrates a reactor system 100 in accordance with at least one embodiment of the disclosure. Reactor system 100 includes a reactor 102 including a reaction chamber 104, a gas distribution device 106, a susceptor 108, gas sources 110-116, an exhaust source 118, a controller 120, and one or more cleaning gas diffusers 132. Although illustrated with one reactor 102/reaction chamber 104, reactor system 100 can include any suitable number of reaction chambers 104 and can optionally include one or more substrate handling systems.

Reactor 102 can be configured as a CVD reactor, a cyclical deposition process reactor (e.g., a cyclical CVD reactor), an ALD reactor, a PEALD reactor, or the like, any of which may include plasma apparatus, such as direct and/or remote plasma apparatus. Reaction chamber 104 can be formed of suitable material, such as quartz, metal, or the like, and can be configured to retain one or more substrates for processing.

Reaction chamber 104 includes an upper chamber portion 124 and a lower chamber portion 126. Upper chamber portion 124 and lower chamber portion 126 can be separated by an isolation plate 128. Additionally or alternatively, upper chamber portion 124 can be above a top surface 130 of susceptor 108 and/or lower chamber portion 126 can be below top surface 130 of susceptor 108.

Gas distribution device 106 provides gas from one or more gas sources 110-116 to upper chamber portion 124. By way of examples, gas distribution device 106 can be or include an assembly that includes a showerhead device.

Susceptor 108 can support a substrate to be processed and can be positioned below gas distribution device 106. In accordance with examples of the disclosure, susceptor 108 can be or include an electrostatic chuck that supports a substrate during processing. Susceptor 108 can be coupled to moveable shaft 109, which can move susceptor 108 from a processing position to a cleaning position, as described below.

Gas sources 110-116 can each include a vessel and a reactant, precursor, or cleaning reactant stored within the respective vessel. By way of example, first gas source 110 can include a vessel and a carrier gas; second gas source 112 can include a vessel and a precursor for a deposition or etch process; third gas source 114 can include a vessel and a reactant; and fourth gas source 116 can include a vessel and a cleaning reactant.

As illustrated, in some cases, fourth gas source 116 can be directly fluidly coupled to lower chamber portion 126, to a remote plasma unit 122, or alternatively, directly to upper chamber portion 124. Further, any of gas sources 110-116 can be coupled to RPU 122 and/or can bypass RPU 122 and be coupled to gas distribution device 106 or upper chamber portion 124. Further, although illustrated with four gas sources 110-116, exemplary systems can include any suitable number of gas sources (e.g., four or more) coupled to reaction chamber 104.

Exemplary cleaning reactants include a halogen containing gas, such as a gas comprising one or more of F, Cl, Br, and I. By way of particular examples, the cleaning reactant can comprise fluorine (e.g., $NF_3$, F*).

Exhaust source 118 can include, for example, one or more vacuum sources. Exemplary vacuum sources include one or more dry vacuum pumps and/or one or more turbomolecular pumps.

Controller 120 can be configured to perform various functions and/or steps as described herein. Controller 120 can include one or more microprocessors, memory elements, and/or switching elements to perform the various functions. Although illustrated as a single unit, controller 120 can alternatively comprise multiple devices. By way of examples, controller 120 can be used to control gas flow from one or more gas sources 110-114 to reaction chamber 104 during a process; gas flow from cleaning reactant source 116 to cleaning gas diffuser 132 during a cleaning process, and/or exhaust source 118 during a process and/or a cleaning process.

In accordance with various examples of the disclosure, reactor system 100 includes at least one cleaning gas diffuser 132. Cleaning gas diffuser 132 can be located within lower chamber portion 126 (as illustrated), within upper chamber portion 124, or in between lower chamber portion 126 and upper chamber portion 124—e.g., about coplanar (e.g., within about 5.5 mm of top surface 130. In cases in which susceptor 108 does not move, it may be desirable to position cleaning gas diffuser 132 at or near top surface 130.

Reactor system 100 can also include remote plasma unit 122 fluidly coupled to reaction chamber 104. As illustrated, RPU 122 can receive gas from one or more gas sources 110-116.

Isolation plate 128 can be used to control a flow of gas between upper chamber portion 124 and lower chamber portion 126. In accordance with examples of the disclosure, one or more cleaning gas diffusers 132 are positioned below isolation plate 128.

Reactor 102 can also include one or more exhaust ports 134 (above) and 136 (below) top surface 130. Exhaust port 134 can be above cleaning gas diffuser 132 and exhaust port 136 can be below cleaning gas diffuser 132. During operation, either or both of exhaust port 134 and exhaust port 136 can exhaust a cleaning reactant.

During operation, susceptor 108 can be moved from a processing position to a cleaning position prior to a step of providing a cleaning reactant. In some cases, in the cleaning position, a bottom surface 131 of susceptor 108 is above the plurality of holes of cleaning gas diffuser 132. In some cases, a first cleaning gas diffuser is above the susceptor and a second cleaning gas diffuser is below the susceptor—e.g., below a bottom surface of susceptor 108. In some cases, susceptor 108 is not moved to perform the cleaning. In some cases, in the cleaning position, a top surface 130 of susceptor 108 is below the plurality of holes in cleaning gas diffuser 132.

Once the susceptor 108 is in a cleaning position, reactant from cleaning reactant source 116 can be provided though a bottom wall of reaction chamber 104 to cleaning gas diffuser 132 to clean susceptor 108 and/or lower chamber portion 126. The cleaning reactant can be exhausted using exhaust source 118—either through lower chamber portion 126 or upper chamber portion 124. A gas, such as an inert gas (e.g., argon, $N_2$) can be provided through gas distribution device 106 to mitigate interaction of the cleaning reactant with the gas distribution device 106. A flowrate of the inert gas can be between about 800 sccm and 1200 sccm or about 900 sccm and 1000 sccm. In accordance with further examples, the cleaning reactant or tubes carrying the cleaning reactant and/or the injector portion can be heated—e.g., to a temperature of about 140° C. to about 150° C. A flowrate of the cleaning reactant can be between about 300 and about 450 sccm per chamber.

A temperature within reaction chamber 104 during a cleaning process can be between about 300° C. to about 550° C. For example, susceptor 108 can be heated to such temperatures. A pressure within the reaction chamber can be sub atmospheric, such as between about 30 and about 60 Torr.

Figure 2:
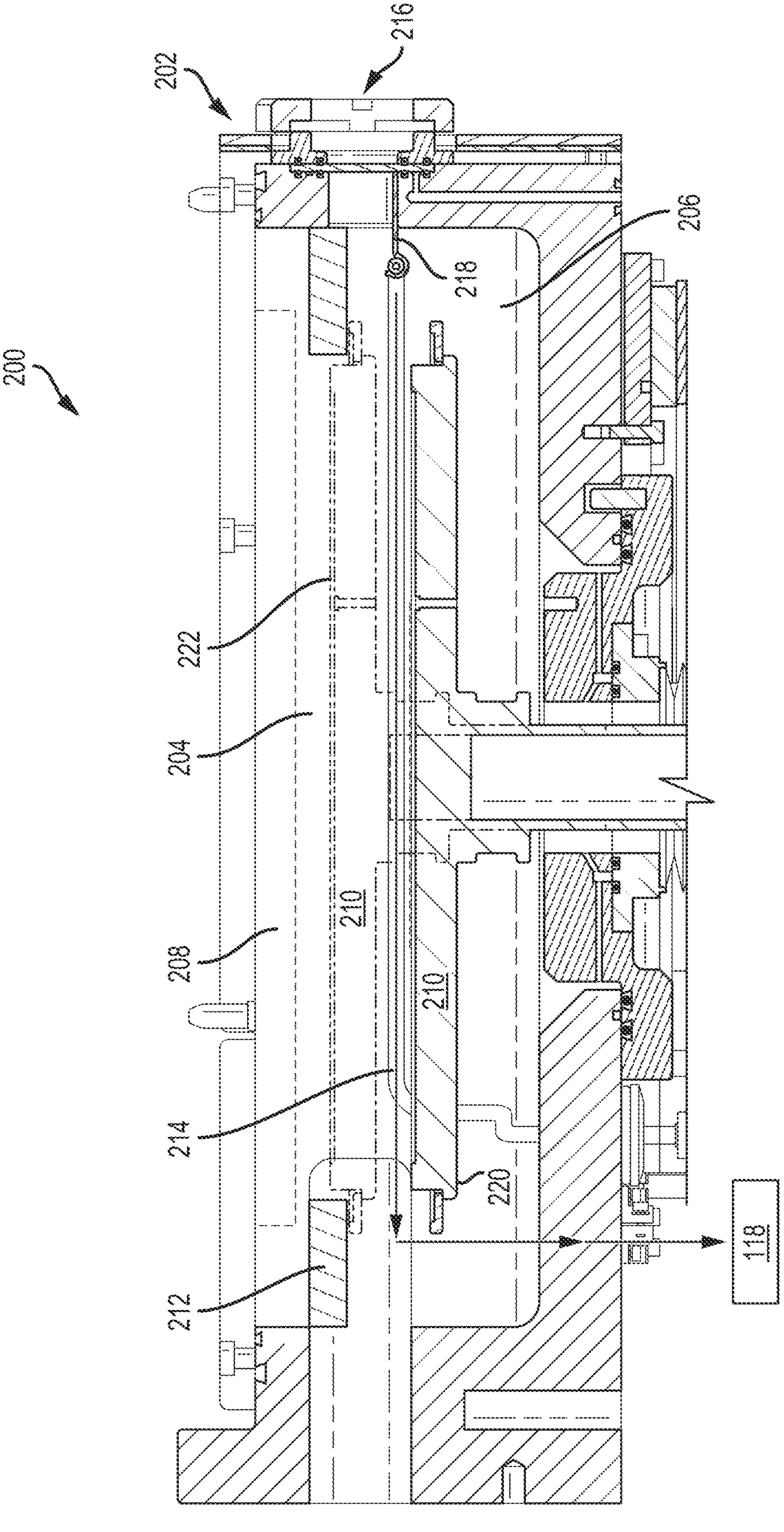
FIGS. 2 and 3 illustrate a portion of a reactor in accordance with examples of the disclosure.

Turning now to FIG. 2, a portion of a reactor 200, suitable for use as reactor 102, is schematically illustrated in a cross-sectional view. Reactor 200 includes a reaction chamber 202, including an upper chamber portion 204 and a lower chamber portion 206; a gas distribution device 208; a susceptor 210, shown in two different positions; an isolation plate 212; and a cleaning gas diffuser 214, which can each be the same or similar to the corresponding components described in connection with FIG. 1.

Susceptor 210 can move from a process position (top position) to a cleaning position (bottom position). In accordance with examples of the disclosure, susceptor 210 can move about 80 to about 120 or about 90 mm in a vertical direction.

In the illustrated example, cleaning gas diffuser 214 is located within lower chamber portion 206. In the illustrated example, cleaning gas diffuser 214 is supported using one or more supports 218 within reaction chamber 202. Supports 218 can be mounted to, for example, a view port 216 within reaction chamber 202.

Cleaning gas diffuser 214 can be formed of any suitable material, such as aluminum, Hastelloy C22, or the like. An interior of cleaning gas diffuser 214 can include coating. The coating can be or include, for example, yttrium, alumina, or the like.

Cleaning gas diffuser 214 can be formed of tubing having an inside diameter of about 5.46 mm and/or an outside diameter of about 6.35 mm. Cleaning gas diffuser 214 provides cleaning reactant to lower chamber portion 206, which can be exhausted using exhaust source 118. In the illustrated example, cleaning gas diffuser 214 can be used to clean a bottom surface 220 of susceptor 210 when susceptor 210 is in an elevated position and can be used to clean a top surface 222 of susceptor 210 when susceptor 210 is in a lowered position.

Figure 3:
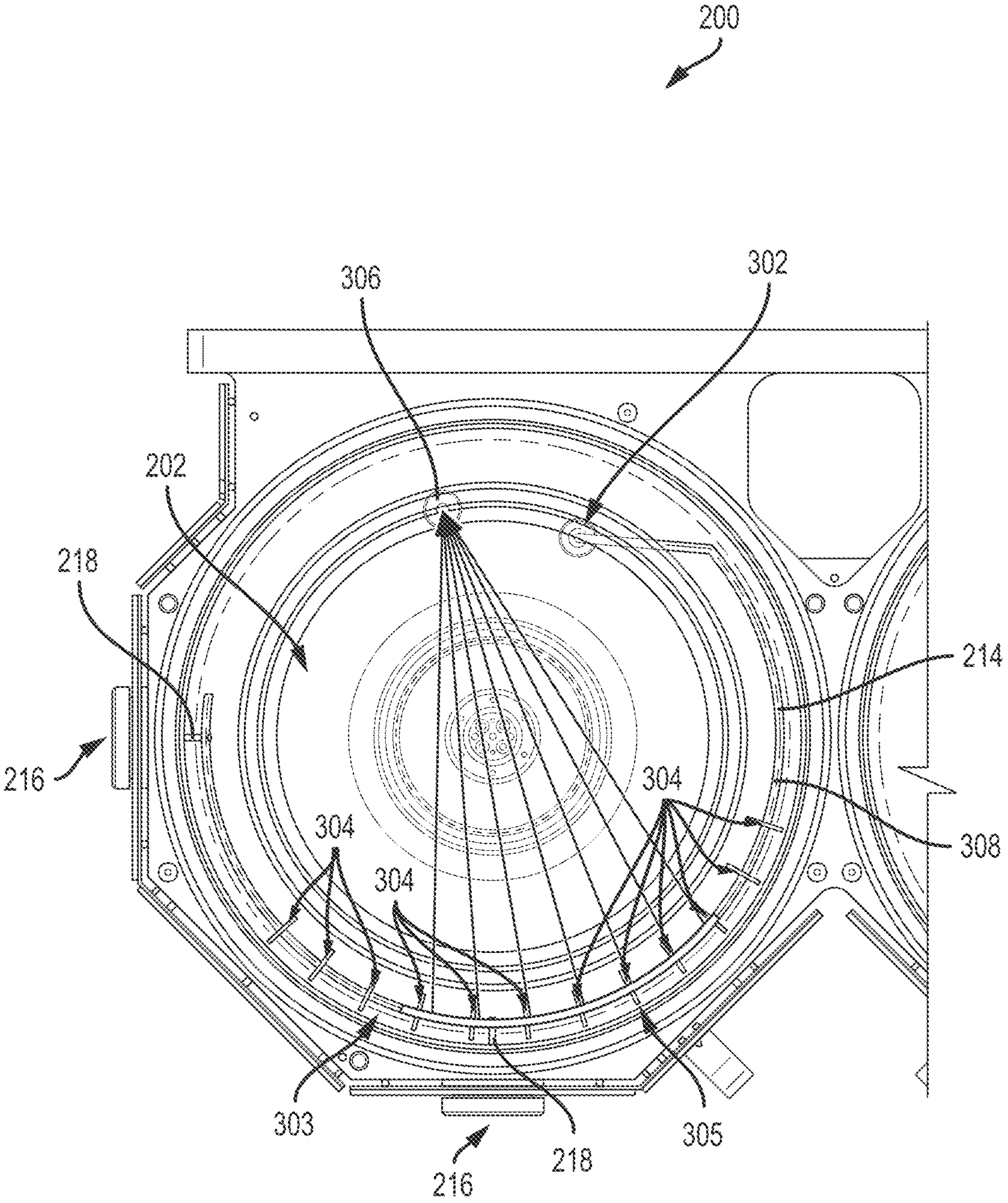

FIG. 3 illustrates a top view of a portion of reactor 200 with components removed to illustrate exemplary cleaning gas diffuser 214 more clearly. In the illustrated example, cleaning gas diffuser 214 includes a tube 308 including an inlet 302 at a bottom of reaction chamber 202 and an injector portion 303, including a plurality of outlets 304. Each outlet 304 may be a hole formed within tube 308. The holes can be (e.g., evenly) spaced apart at intervals of, for example, 5, 10, 15, or 30 degrees or about one to about 10 mm apart. Injector portion 303 may suitably include an arcuate shaped portion 305. Other shapes, such as other shapes described herein, are also suitable. Cleaning gas diffuser 214 can be generally shaped as a partial circle, with a diameter greater than, about equal to, or less than a diameter of susceptor 210. Outlets 304 may, for example, span about 60 to about 180 or about 90 to about 150 or about 120 degrees along a circumference or perimeter of cleaning gas diffuser 214 (e.g., along arcuate shaped portion 305). A diameter of outlets 304 can be about 0.5 to about 2 or about 1 mm. The outlets can be positioned opposite a lower chamber portion exhaust outlet (i.e., a lower chamber exhaust port through a wall of the lower chamber portion) 306 formed within reaction chamber 202. This configuration facilitates flow of a cleaning reactant across a surface of susceptor 210 and consequently cleaning of susceptor 210.

As illustrated, injector portion 303 can be positioned below isolation plate 128/212. Additionally or alternatively, injector portion 303 can be above a top surface of the susceptor 210.

Figure 5:
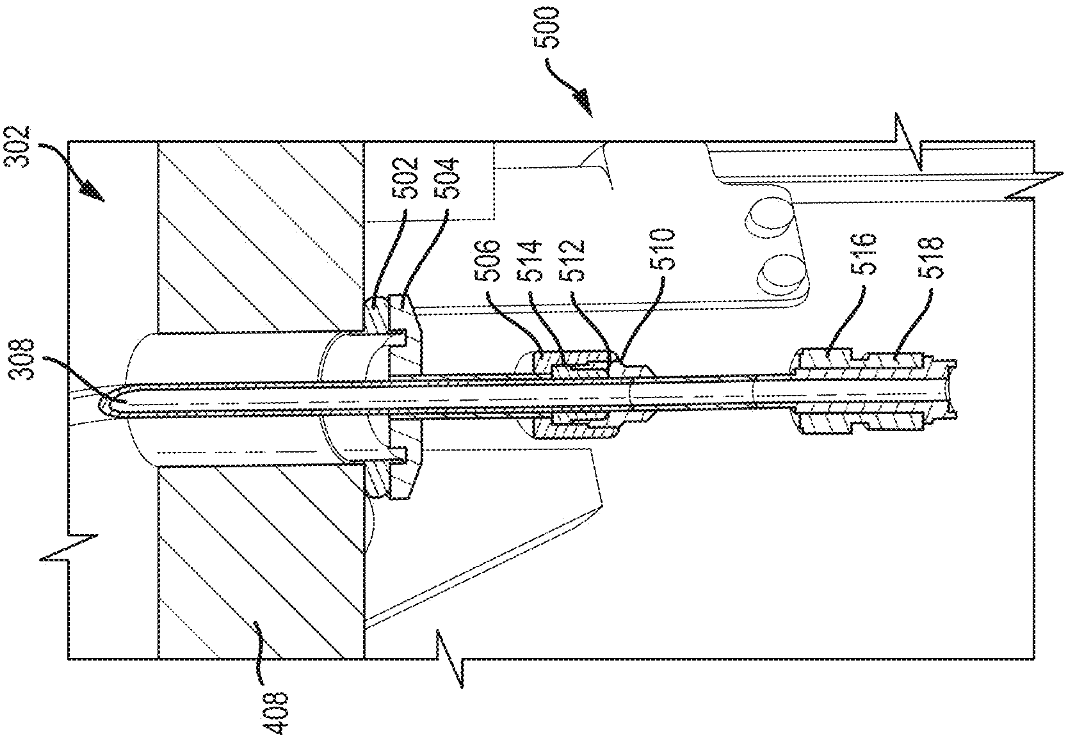
FIGS. 4 and 5 illustrate feedthrough connections in accordance with examples of the disclosure.
Figure 4:
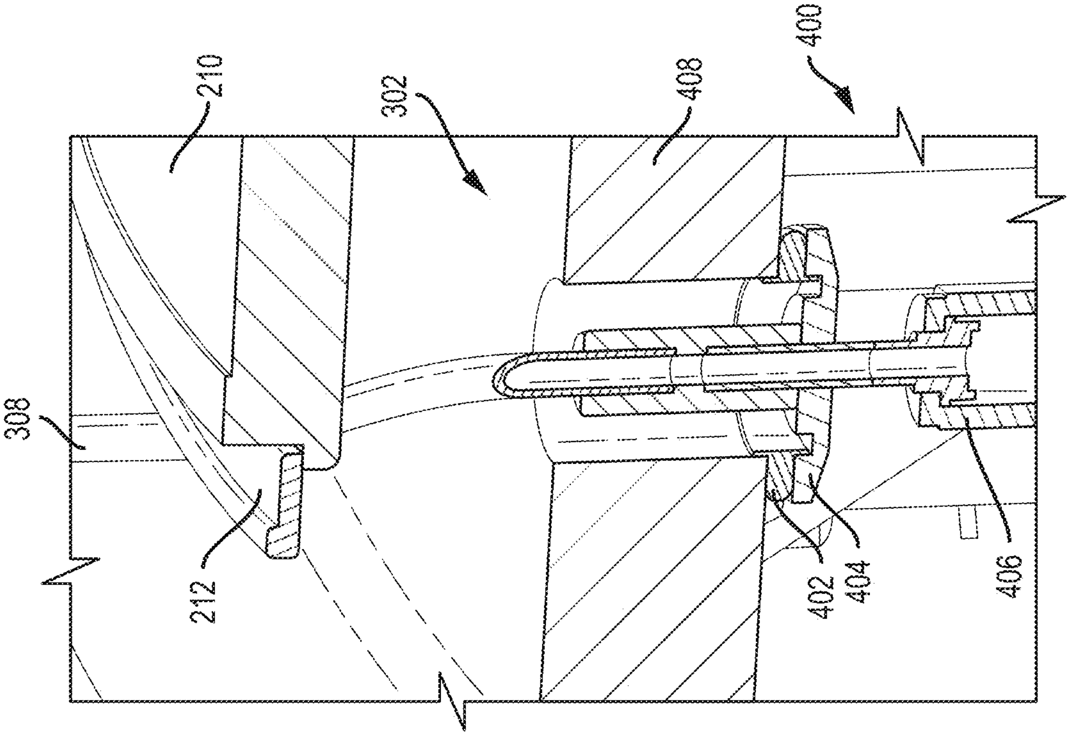

FIGS. 4 and 5 illustrate exemplary feedthrough connectors 400 and 500 for connecting cleaning gas diffuser 214 through inlet 302 to outside reaction chamber 202 with a sealed connection. Feedthrough connectors 400 and 500 can receive a portion of cleaning gas diffuser 214 and form a seal between cleaning gas diffuser 214 and reaction chamber 202.

Feedthrough connector 400 includes a seal 402 and a sleeve fitting 404. Seal 402 can be a thermal expansion seal formed of, for example SS216. Sleeve fitting 404 can be formed of, for example, aluminum and have a tolerance of, for example, about ±9.127 mm. Tube 308 of cleaning gas diffuser 214 can then connect to other tubing 406, which can be formed of, for example, stainless steel. Feedthrough connector 500 can include an ultratorr (e.g., available from Swagelok) connection. Feedthrough connector 500 includes a seal 502 and a flange fitting 504, which can be welded to tube 308. Feedthrough connector 500 can further include a nut 506 that couples to an ultratorr body 510. Ultratorr body 510 can couple to nut 506 via an O-ring 512 and weld 514. A vacuum coupling radiation (VCR) nut 516 and gland 518 can be used to couple tube 308 to another tube or the like. Seal 502 can be a thermal expansion seal formed of, for example Kalrez® elastomer. Sleeve fitting 504 can be formed of, for example SS216. Tube 308 can then extend through a bottom 408 of reaction chamber 202.

Figure 6:
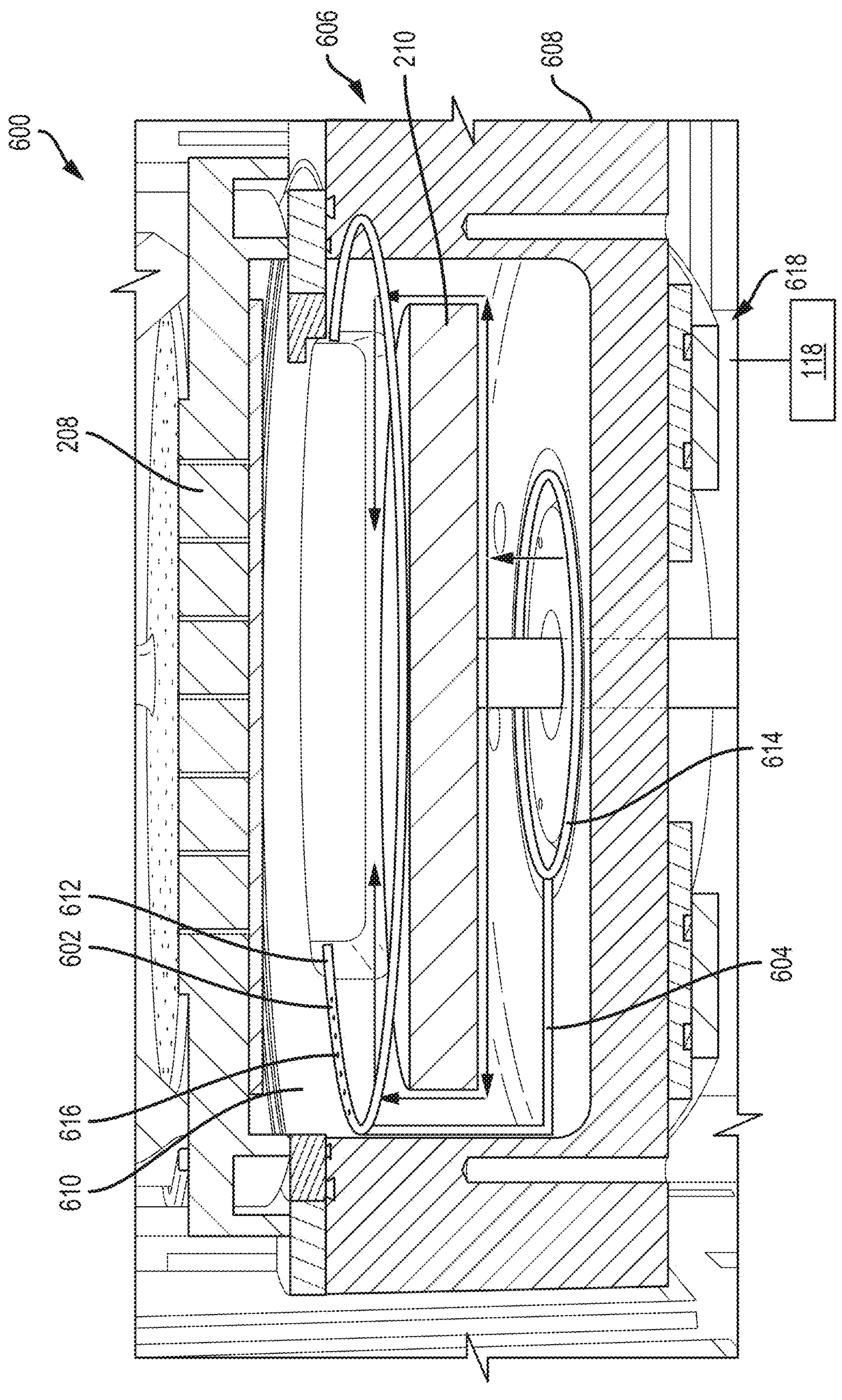
FIG. 6 illustrates another reactor system in accordance with examples of the disclosure.

FIG. 6 illustrates another reactor 600 in accordance with examples of the disclosure. In FIG. 6, susceptor 210 is in a lowered position, such that susceptor 210 is in a lower chamber portion 606 of a reaction chamber 608. Reactor 600 is similar to reactor 200, except reactor 600 includes a first cleaning gas diffuser 602 and second cleaning gas diffuser 604. As illustrated, both first cleaning gas diffuser 602 and second cleaning gas diffuser 604 can be located in lower chamber portion 606 of reaction chamber 608. Alternatively, one of first cleaning gas diffuser 602 and a second cleaning gas diffuser 604 could be located in an upper chamber portion 610 of reaction chamber 608.

In the example illustrated in FIG. 6, both first cleaning gas diffuser 602 and a second cleaning gas diffuser 604 include respective arcuate portions 612, 614 (e.g., circles), with outlets (e.g., holes 616) extending about at least a portion of the circular portions (e.g., about 60 to 180 degrees or about 90 to 150 degrees or about 120 degrees of the arcuate (circular) shaped portion. A cross-sectional (e.g., diameter) dimension of one or more of the holes can be between, for example, about 0.8 mm and about 1.0 mm. The holes of cleaning gas diffuser 602 and/or 604 may be positioned opposite an opening 618 in reaction chamber 608 to exhaust source 118 to facilitate movement of the cleaning reactant across susceptor 210 surfaces.

With the design illustrated in FIG. 6, a top, a side, and a bottom surface of susceptor 210 can be rapidly cleaned. As illustrated, first cleaning gas diffuser 602 may have a larger diameter/perimeter, compared to second cleaning gas diffuser 604. For example, a cross-sectional dimension of cleaning gas diffuser 602 can be larger than a cross-sectional dimension of susceptor 210 and/or a cross-sectional dimension of cleaning gas diffuser 604 can be less than a cross-sectional dimension of susceptor 210.

Figure 7:
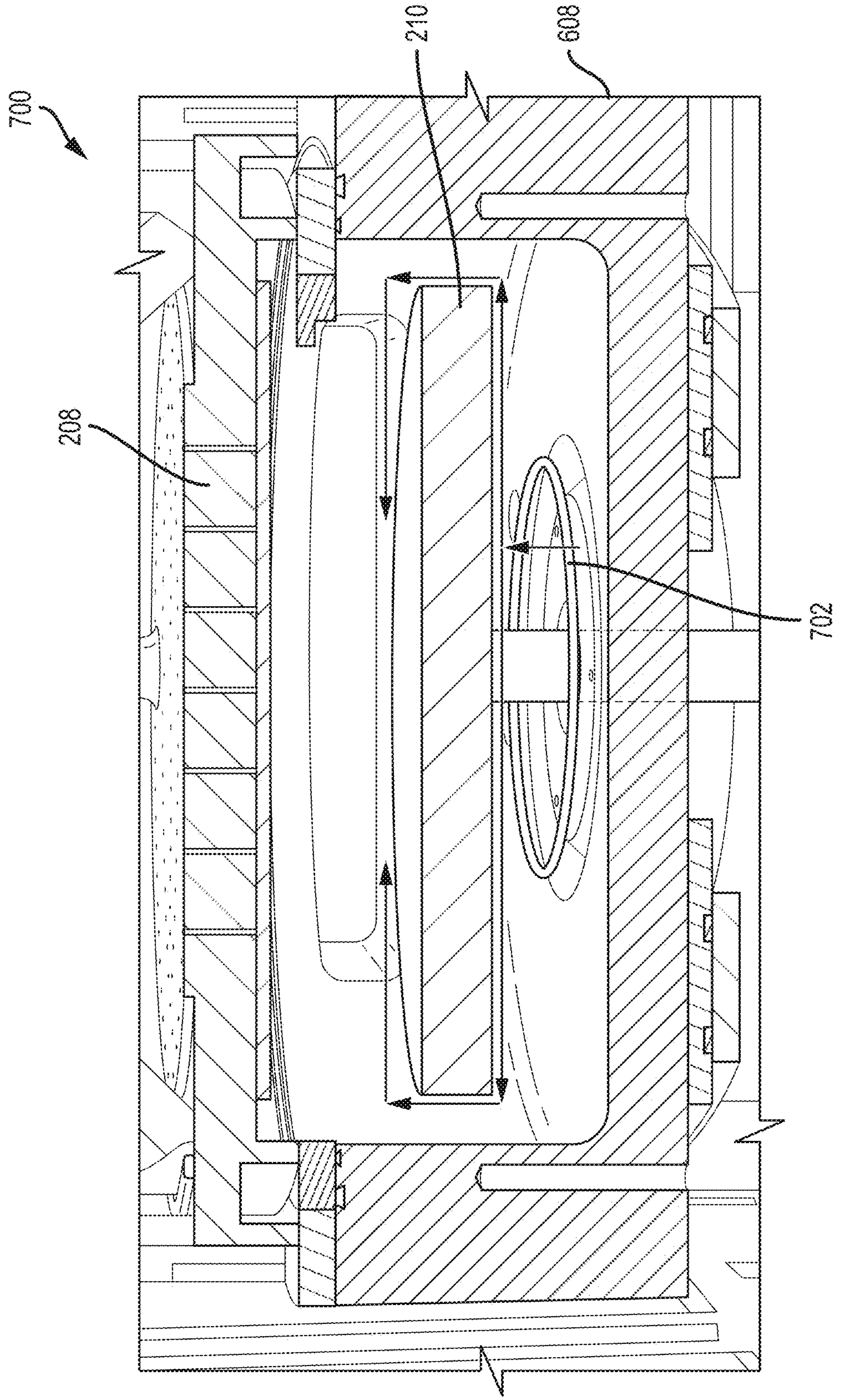
FIG. 7 illustrates yet another reactor system in accordance with examples of the disclosure.

FIG. 7 illustrates another reactor 700 in accordance with examples of the disclosure. Reactor 700 is similar to reactor 600, except reactor 700 includes only a single cleaning gas diffuser 702 (which can be the same or similar to cleaning gas diffuser 604).

Figure 8:
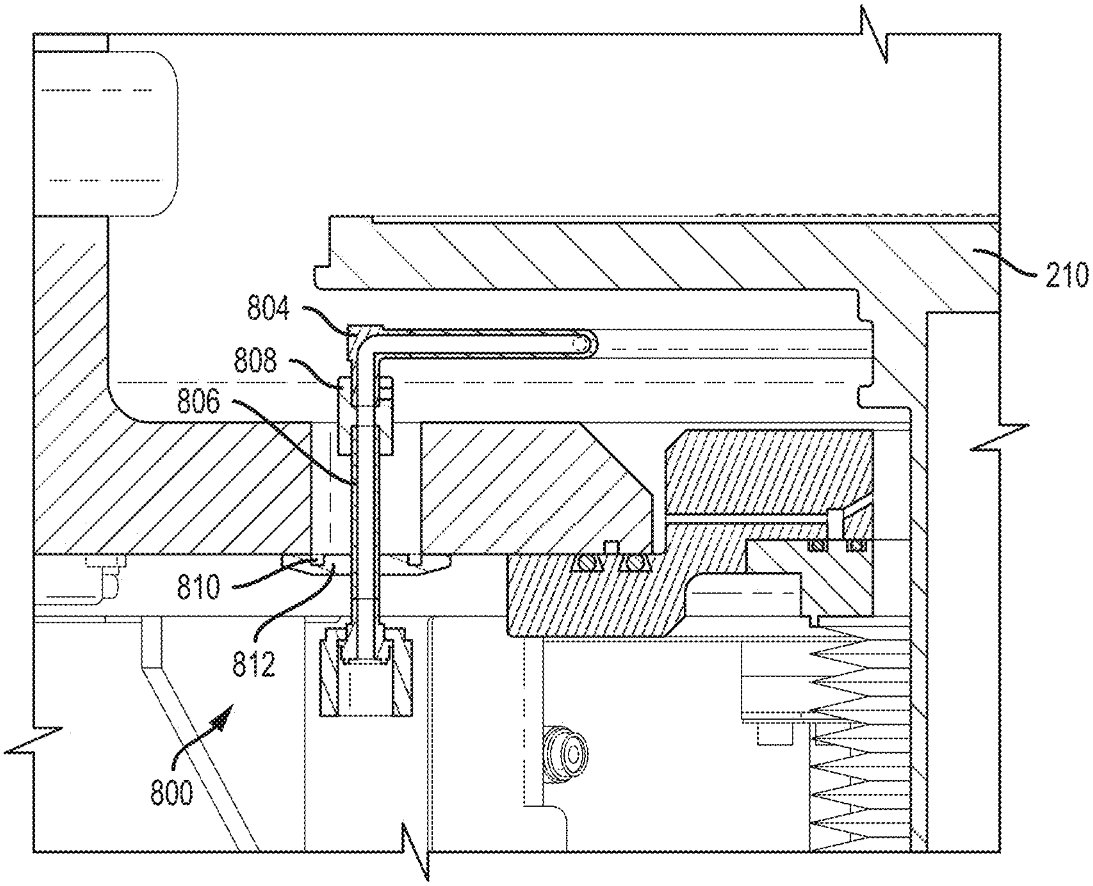
FIG. 8 illustrates another feedthrough connector in accordance with examples of the disclosure.

FIG. 8 illustrates another feedthrough connector 800 in accordance with examples of the disclosure. In the illustrated example, a cleaning gas diffuser 804 (which can be the same or similar to cleaning gas diffuser 214) is coupled to a feedthrough tube 806 using a tube fitting 808. A seal, such as an O-ring 810 and a sleeve fitting 812, can provide a seal between a reaction chamber wall 814 and feedthrough tube 806.

Figure 9:
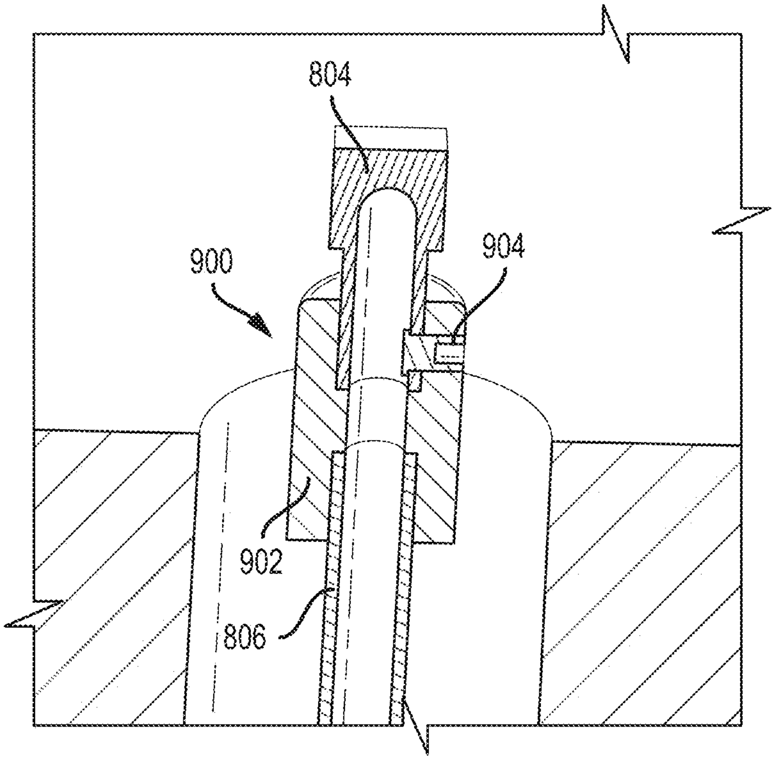
FIGS. 9 and 10 illustrate tube fittings in accordance with examples of the disclosure.
Figure 10:
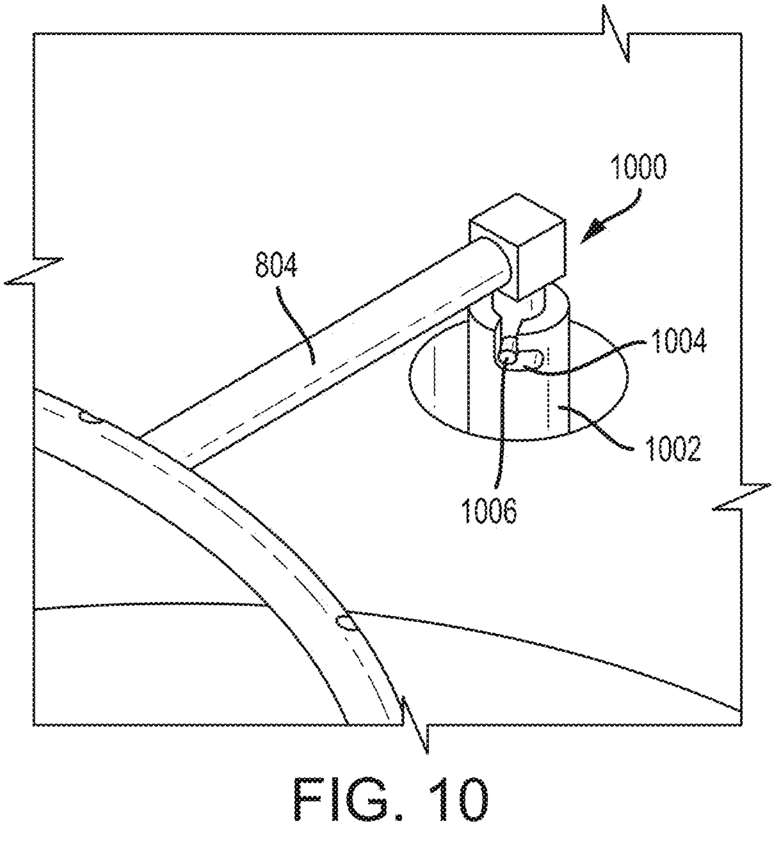

FIGS. 9 and 10 illustrate tube fittings 900 and 1000 suitable for use as tube fitting 808 in accordance with examples of the disclosure. Tube fitting 900 includes collar 902 that can couple to tube 806 and to cleaning gas diffuser 804 using a set screw 904. Tube fitting 1000 includes a collar 1002 that includes a notch 1004 to receive a corresponding protrusion 1006 on cleaning gas diffuser 804. The configuration illustrated in FIG. 10 allows rapid installation or replacement of cleaning gas diffuser 804.

Figure 11:
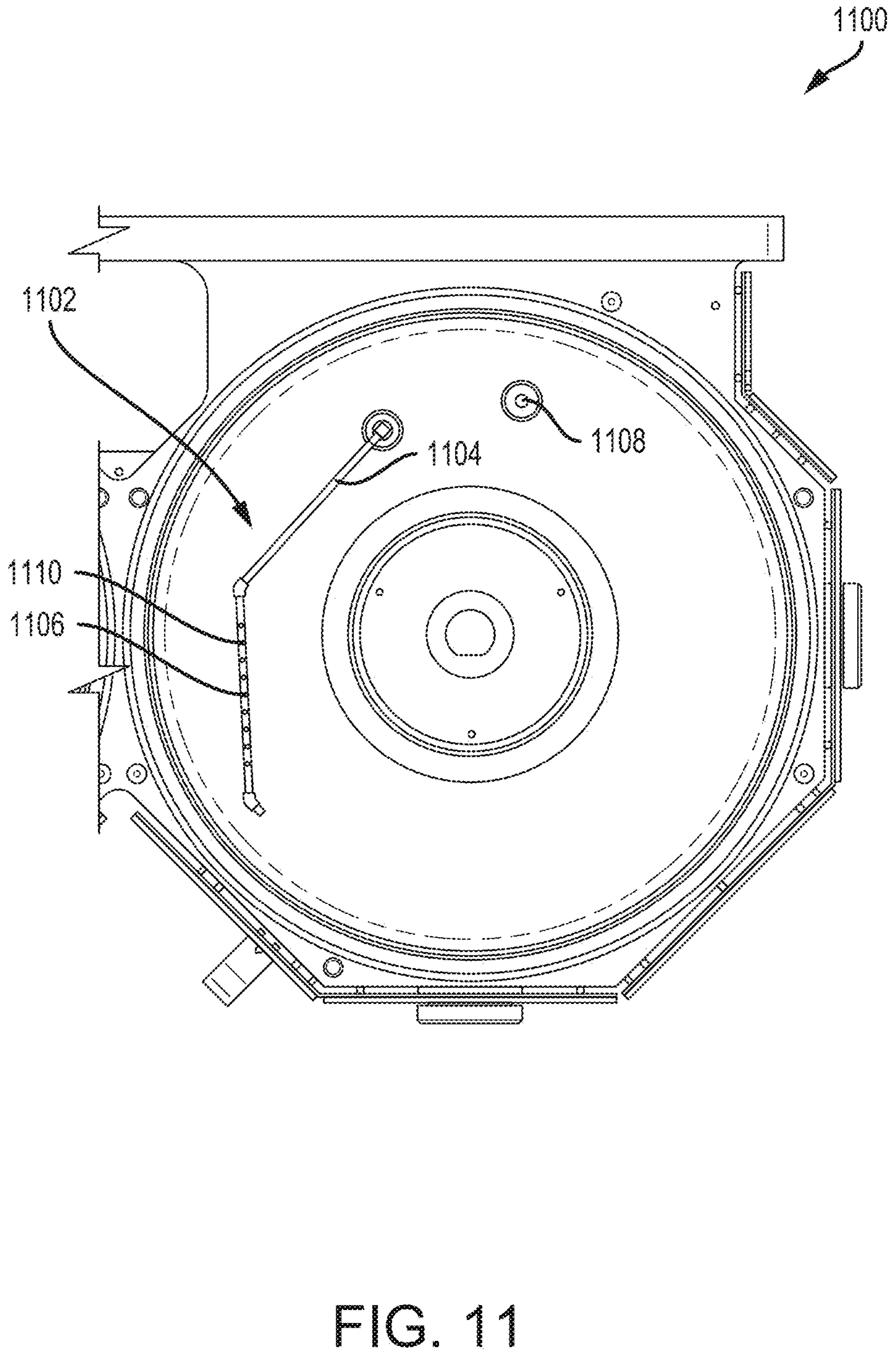
FIG. 11 illustrates another cleaning gas diffuser in accordance with examples of the disclosure.

FIG. 11 illustrates another reactor 1100, including cleaning gas diffuser 1102. Reaction chamber 1100 can be the same or similar to reaction chamber 200, except cleaning gas diffuser 1102 includes linear or straight sections 1104 and 1106, rather than arcuate sections. Sections 1104 and 1106 can be formed of, for example, tubing. Although illustrated with two sections 1104 and 1106, cleaning gas diffuser 1102 can include any suitable number of sections. Similar to the cleaning gas diffusers described above, cleaning gas diffuser 1102 can include a plurality of outlets 1110 (e.g., holes)—e.g., at spacings noted herein. In this case, the holes/outlets may be located on section 1106—e.g., opposite exhaust outlet 1108. Cleaning gas diffuser 1102 can be connected to reaction chamber 1100 using any suitable feedthrough, such as the feedthrough described herein.

Figure 12:
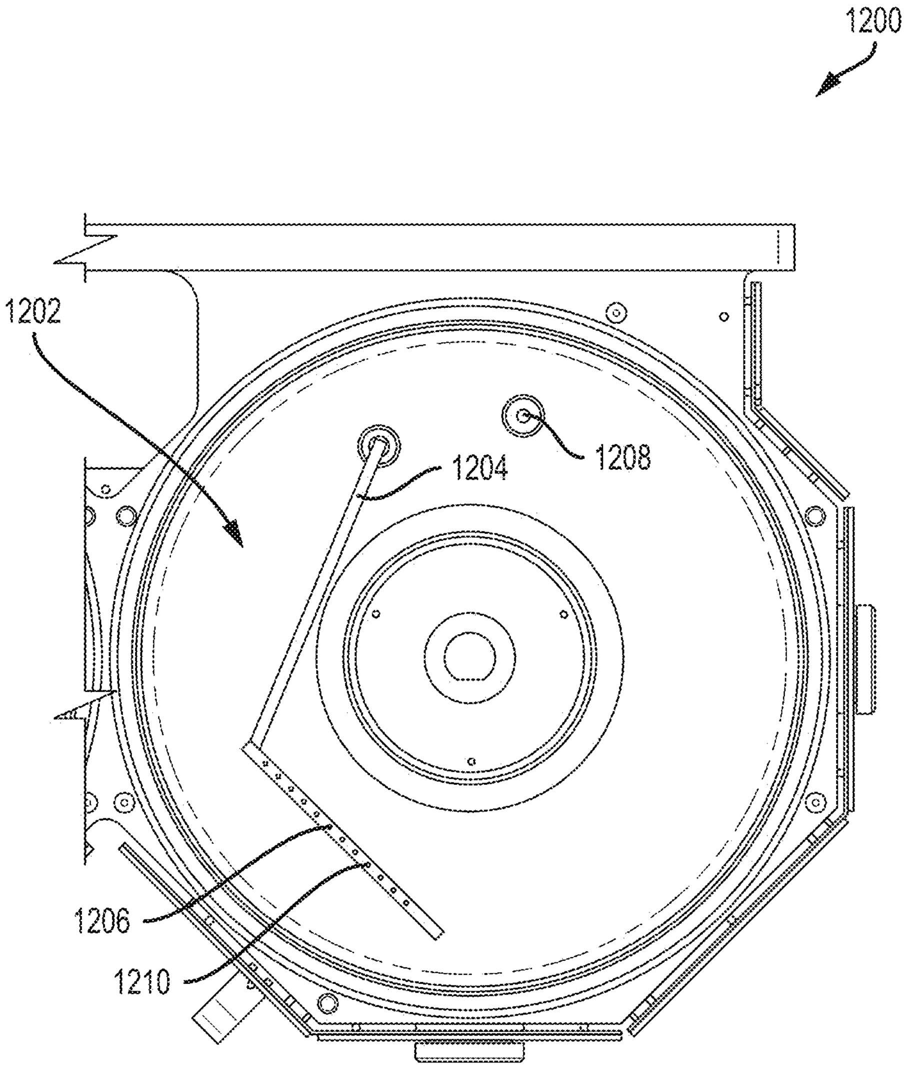
FIG. 12 illustrates yet another cleaning gas diffuser in accordance with examples of the disclosure.

FIG. 12 illustrates another reactor 1200, including cleaning gas diffuser 1202. Reaction chamber 1200 can be the same or similar to reaction chamber 1100, except cleaning gas diffuser 1202 includes sections 1204 and 1206, rather than sections 1104 and 1106. Sections 1204 and 1206 can be formed of, for example, rectangular tubing. For example, section 1204 can have a substantially square or rectangular cross section and section 1206 can have a rectangular cross section—e.g., elongated in the vertical direction. Although illustrated with two sections 1104 and 1106, cleaning gas diffuser 1102 can include any suitable number of sections. Similar to the cleaning gas diffusers described above, cleaning gas diffuser 1102 can include a plurality of outlets 1210—e.g., at spacings noted herein. In this case, the holes/outlets 1210 may be located on section 1206—e.g., opposite exhaust outlet 1208. Cleaning gas diffuser 1102 can be connected to reaction chamber 1100 using any suitable feedthrough, such as the feedthrough described herein.

FIG. 13 illustrates a reactor system 1300 in accordance with further examples of the disclosure. Reactor system 1300 is similar to reactor system 100, except reactor system 1300 includes two (or more) reactors 1302 and 1304. Each reactor 1302 and 1304 can be the same or similar to reactors described above (e.g., reactors 102, 200). As illustrated, two or more reactors 1302 and 1304 can share a common cleaning reactant supply line 1306 to provide a cleaning reactant to cleaning gas diffusers 1312, which may be, for example, any of the cleaning gas diffusers described herein. In addition, two or more reactors 1302 and 1304 can share a common exhaust source line 1308 and be coupled to exhaust source 118.

The example embodiments of the disclosure described above do not limit the scope of the invention, since these embodiments are merely examples of the embodiments of the invention. For example, some systems are illustrated with certain cleaning gas diffusers, but exemplary systems can include any combination of cleaning gas diffusers. Any equivalent embodiments are intended to be within the scope of this invention. Indeed, various modifications of the disclosure, in addition to those shown and described herein, such as alternative useful combinations of the elements described, may become apparent to those skilled in the art from the description. Such modifications and embodiments are also intended to fall within the scope of the appended claims.

The invention claimed is:

1. A reactor system comprising: a reaction chamber comprising an upper chamber portion and a lower chamber portion; a gas distribution device for providing gas to the upper chamber portion; a susceptor positioned below the gas distribution device; a first cleaning gas diffuser comprising a first injector portion comprising a plurality of holes; a second cleaning gas diffuser; a cleaning reactant source, comprising a cleaning reactant, fluidly coupled to the first cleaning gas diffuser and the second cleaning gas diffuser, the first cleaning gas diffuser and the second cleaning gas diffuser fluidly coupled to each other; and at least one exhaust source coupled to the reaction chamber, wherein during a cleaning process, the first cleaning gas diffuser is positioned above the susceptor and the second cleaning gas diffuser is below the susceptor.

2. The reactor system of claim 1, wherein the first injector portion comprises an arcuate shaped portion.

3. The reactor system of claim 2, wherein holes are located along an arc extending about 60 to 180 degrees or about 90 to 150 degrees of the arcuate shaped portion.

4. The reactor system of claim 1, further comprising a lower chamber exhaust port through a wall of the lower chamber portion, the lower chamber exhaust port opposite the injector portion.

5. The reactor system of claim 1, further comprising a feedthrough connector, wherein the feedthrough connector receives a portion of the first cleaning gas diffuser.

6. The reactor system of claim 1, further comprising a moveable shaft, wherein the moveable shaft moves the susceptor from a processing position to a cleaning position.

7. The reactor system of claim 6, wherein, in the cleaning position, a bottom surface of the susceptor is above the plurality of holes.

8. The reactor system of claim 1, wherein the first cleaning gas diffuser comprises aluminum or yttrium.

9. The reactor system of claim 1, further comprising an isolation plate between the upper chamber portion and the lower chamber portion, wherein the injector portion is below the isolation plate.

10. The reactor system of claim 1, wherein the injector portion is positioned below a bottom surface of the susceptor.

11. The reactor system of claim 1, wherein the injector portion is positioned above a top surface of the susceptor.

12. The reactor system of claim 1, wherein a cross-sectional dimension of one or more of the holes is between about 0.8 mm and about 1 mm.

13. The reactor system of claim 1, comprising an exhaust port positioned above the injector portion.

14. The reactor system of claim 1, wherein the first cleaning gas diffuser has a cross-sectional dimension greater than a cross-sectional dimension of the susceptor and wherein the second cleaning gas diffuser has a cross-sectional dimension less than the cross-sectional dimension of the susceptor.

* * * * *